(12) United States Patent
Hayashi

(10) Patent No.: US 10,969,426 B2
(45) Date of Patent: Apr. 6, 2021

(54) SEMICONDUCTOR INTEGRATED CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Tsuneyuki Hayashi, Kodaira (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 40 days.

(21) Appl. No.: 16/526,890

(22) Filed: Jul. 30, 2019

(65) Prior Publication Data
US 2020/0292614 A1 Sep. 17, 2020

(30) Foreign Application Priority Data

Mar. 12, 2019 (JP) .............................. JP2019-044712

(51) Int. Cl.
*G01R 31/28* (2006.01)

(52) U.S. Cl.
CPC ..... *G01R 31/2879* (2013.01); *G01R 31/2856* (2013.01); *G01R 31/2889* (2013.01)

(58) Field of Classification Search
CPC ............ G01R 31/2879; G01R 31/2889; G01R 31/2856
See application file for complete search history.

(56) References Cited

U.S. PATENT DOCUMENTS

| 2007/0120560 A1* | 5/2007 | Rempt | G01N 27/82 324/238 |
| 2011/0109321 A1 | 5/2011 | Kawabata et al. | |
| 2011/0133732 A1* | 6/2011 | Sauber | G01R 33/0023 324/251 |
| 2013/0265041 A1* | 10/2013 | Friedrich | G01R 15/207 324/260 |

FOREIGN PATENT DOCUMENTS

| JP | H0593756 A | 4/1993 |
| JP | H10275428 A | 10/1998 |
| JP | 2011102798 A | 5/2011 |

* cited by examiner

*Primary Examiner* — Giovanni Astacio-Oquendo
(74) *Attorney, Agent, or Firm* — Kim & Stewart LLP

(57) ABSTRACT

A semiconductor integrated circuit includes abnormality detectors configured to detect abnormalities in the semiconductor integrated circuit, and a reference voltage output circuit. The reference voltage output circuit includes switches controlled in accordance with detection signals from the abnormality detectors. The reference voltage output circuit is configured to output as an error signal, a reference voltage having one of a plurality of different values depending on conduction states of the switches of the reference voltage output circuit.

15 Claims, 11 Drawing Sheets

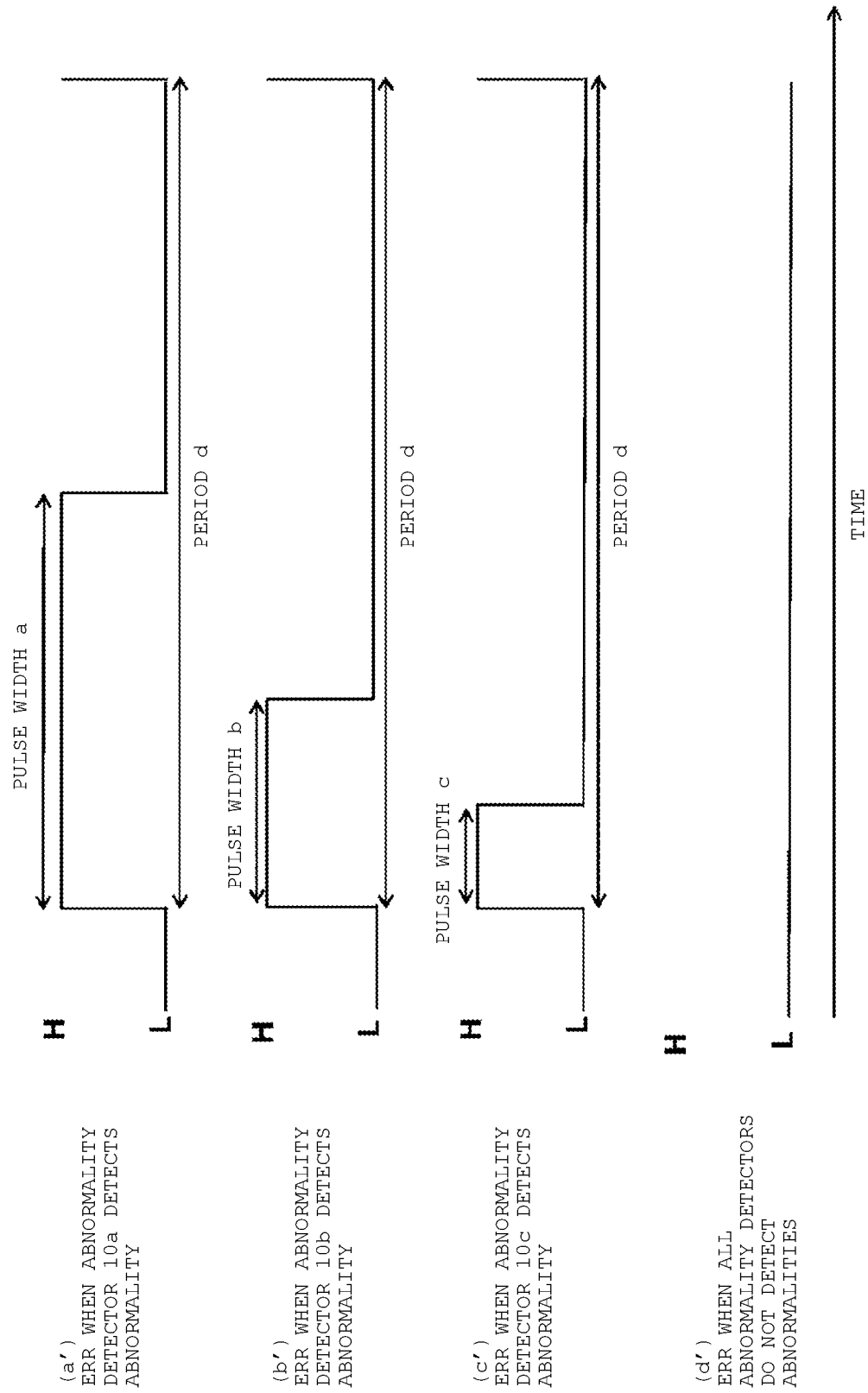

SEMICONDUCTOR INTEGRATED CIRCUIT

CROSS-REFERENCE TO RELATED APPLICATION

This application is based upon and claims the benefit of priority from Japanese Patent Application No. 2019-044712, filed Mar. 12, 2019, the entire contents of which are incorporated herein by reference.

FIELD

Embodiments described herein relate generally to a semiconductor integrated circuit.

BACKGROUND

Some semiconductor integrated circuits (IC: Integrated Circuit) incorporated in a system may have a function of detecting an abnormality of the system and outputting an external error signal for notifying that the abnormality is detected.

DESCRIPTION OF THE DRAWINGS

FIG. 11 is a diagram showing an error output signal ERR when an abnormality is detected in the semiconductor integrated circuit of the fifth embodiment.

DETAILED DESCRIPTION

Embodiments provide a semiconductor integrated circuit capable of determining a content of an abnormality occurring in a system.

In general, according to one embodiment, there is provided a semiconductor integrated circuit including a first abnormality detector configured to detect a first abnormality in the semiconductor integrated circuit and output a first detection signal, a second abnormality detector configured to detect a second abnormality in the semiconductor integrated circuit and output a second detection signal, and a reference voltage output circuit. The reference voltage output circuit includes a first resistor and a second resistor which are connected in series between a power supply terminal to which a power supply potential is to be applied and a ground terminal to which a ground potential is to be applied, a first switch having a first end electrically connected to a first node at a first end of the first resistor, a second end, and a gate electrically connected to an output of the first abnormality detector, and a second switch having a first end electrically connected to a second node at a first end of the second resistor and a second end of the first resistor, a second end, and a gate electrically connected to an output of the second abnormality detector. The reference voltage output circuit is configured to output through an output terminal as an error signal, a reference voltage having one of a plurality of different values depending on conduction states of a plurality of switches of the reference voltage output circuit that include the first switch and the second switch.

Hereinafter, semiconductor integrated circuits according to embodiments will be described in detail with reference to the drawings. The present disclosure is not limited by these embodiments. For example, the number of abnormality detectors or the number of resistors or switches provided corresponding to the abnormality detectors is not limited to the number described in the present specification, and may be freely changed.

First Embodiment

Figure 1:
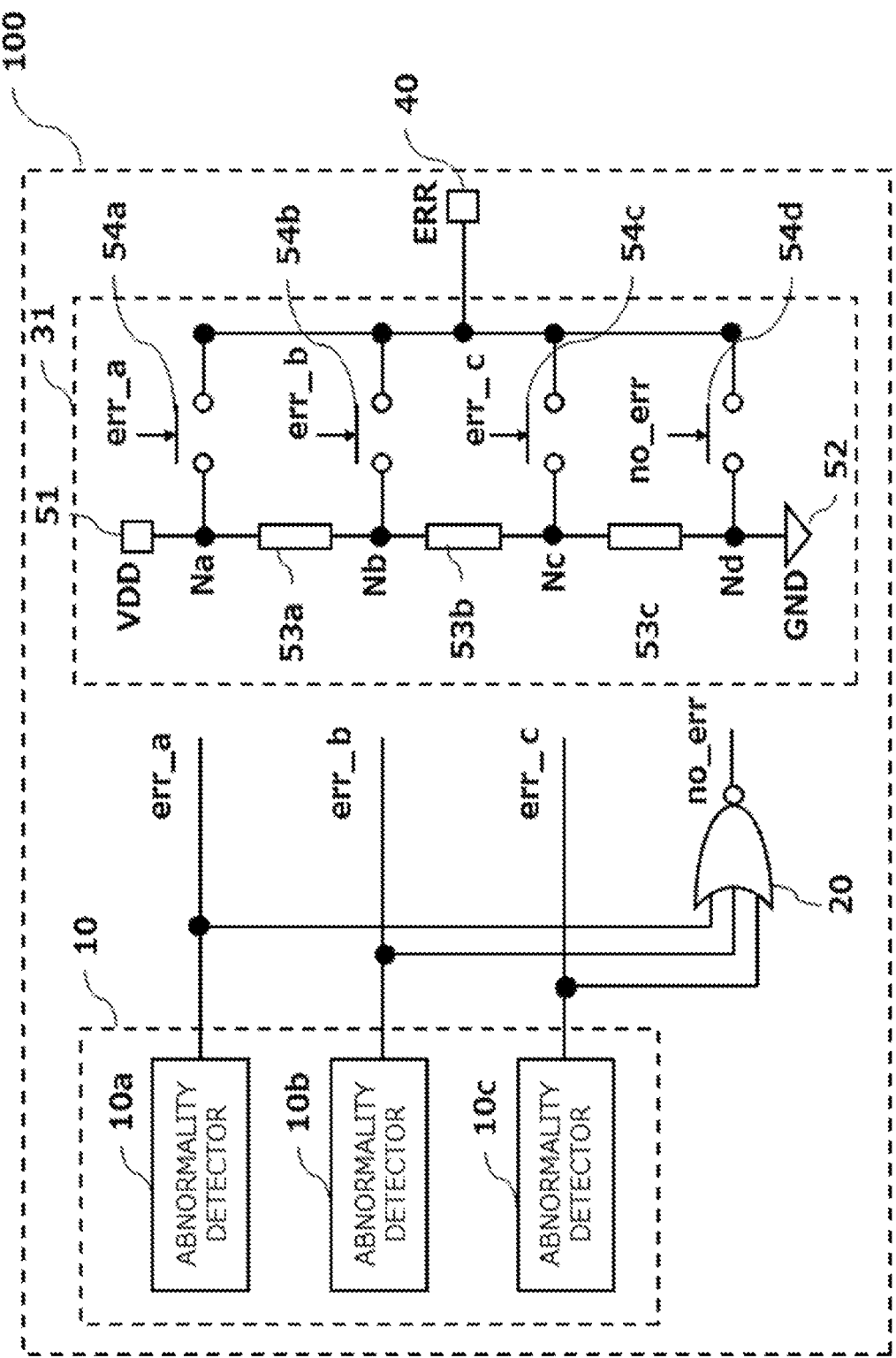
FIG. 1 is a schematic circuit diagram showing a configuration of a semiconductor integrated circuit of a first embodiment.

FIG. 1 is a schematic circuit diagram showing a configuration of a semiconductor integrated circuit 100 of a first embodiment. The semiconductor integrated circuit 100 of the first embodiment is a circuit that may be incorporated into various systems such as a control device, an information processing device, a measurement device, an inspection device, and a manufacturing device. The semiconductor integrated circuit detects abnormalities of the system, and outputs external error signals ERR having potentials different for different kinds of detected abnormalities.

The semiconductor integrated circuit 100 includes a plurality of abnormality detection circuits (referred to herein as abnormality detectors 10), a no_error detector 20 (shown as a NOR gate), a reference voltage output circuit 31, and a common output terminal 40.

Hereinafter, an example in which three abnormality detectors 10a, 10b, and 10c are provided as the abnormality detectors 10 will be described. The number of abnormality detectors may be appropriately set as needed. For example, two or four or more abnormality detectors 10 may be provided.

The abnormality detector 10a outputs an internal error signal err_a depending on whether or not an abnormality of a first type in the system is detected. The abnormality detector 10b outputs an internal error signal err_b depending on whether or not an abnormality of a second type in the system is detected. The abnormality detector 10c outputs an internal error signal err_c depending on whether or not an abnormality of a third type in the system is detected.

The kinds or detection methods of the abnormalities detected by these abnormality detectors 10 (10a to 10c) are not limited. For example, the abnormality detector may be an overcurrent detector that detects a current equal to or greater than a rated value, an overvoltage detector that detects a voltage equal to or greater than a rated value, an overheat detector that is capable of measuring a temperature and measures a temperature equal to or a rated value, a vibration detector or a pressure detector that is capable of measuring an acceleration or a pressure and detects a dynamic load, or a coding error detector that detects an abnormality in coding/decoding of a digital signal. As stated above, the abnormality detectors 10 may be applied to the various systems, and the detector corresponding to the abnormality to be detected may be appropriately selected.

For example, the internal error signals err_a, err_b, and err_c from the abnormality detectors 10a, 10b, and 10c are output as binary potentials of a high potential (H) and a low potential (L). Hereinafter, an example in which a low potential (L) is output when the abnormality is not detected and a high potential (H) is output when the abnormality is detected will be described, in which the potentials to be output may be set as reversal potentials.

When any abnormality does not occur in the system (that is, when none of the abnormality detectors 10a to 10c outputs error signals err_a(H), err_b(H), and err_c(H) each indicating that the abnormality occurs), the no_error detector 20 outputs a no_error signal no_err(H) having a high potential (H). In contrast, when any abnormality occurs in the system (that is, when any of the abnormality detectors 10a to 10c outputs any of the internal error signals err_a(H) to err_c(H)), the no_error detector outputs a no_error signal no_err(L) having a low potential (L).

As shown in FIG. 1, the no_error detector 20 may use, for example, a negative logical sum (NOR) circuit. The negative logical sum circuit is a kind of logic gate which inverts (NOT) a logical sum (OR) of all inputs and outputs the inverted logical sum. Three input terminals corresponding to the abnormality detectors 10a to 10c are provided at the no_error detector 20, and the internal error signals err_a, err_b, and err_c output from the abnormality detectors 10a, 10b, and 10c are input to the three input terminals. The no_error detector 20 receives the input internal error signals err_a to err_c, and outputs the no_error signal no_err(H or L) which is a signal of the negative logical sum thereof through an output terminal.

As mentioned above, when all the internal error signals err_a to err_c input to the no_error detector 20 have low potentials (L), since there is no abnormality, the output of the no_error signal no_err has a high potential (H). When any of the internal error signals has a high potential (H), since there is an abnormality, the output of the no_error signal no_err has a low potential (L). As described above, the potential output from the no_error detector 20 may be set as a reversal potential.

Next, the reference voltage output circuit 31 includes three resistors 53a, 53b, and 53c, and four switches 54a, 54b, 54c, and 54d. The reference voltage output circuit 31 outputs four reference voltages Vref_a, Vref_b, Vref_c, and Vref_d by resistive voltage dividing of three resistors 53a to 53c.

That is, the three resistors 53a to 53c are electrically connected in series in order from a power supply terminal 51 between the power supply terminal 51 to which a power supply potential VDD is applied and a ground terminal 52 to which a ground potential GND is applied. For example, the resistors 53a to 53c have the same resistance value. It is assumed that potentials generated at a node Na between the power supply terminal 51 and the resistor 53a, a node Nb between the resistor 53a and the resistor 53b, a node Nc between the resistor 53b and the resistor 53c, and a node Nd between the resistor 53c and the ground terminal 52 are reference voltages Vref_a, Vref_b, Vref_c, and Vref_d, respectively. In the present specification, the reference voltage refers to a potential appearing at each node, and is expressed as the voltage in order to express the potential at each node with the ground potential GND as a reference for the sake of convenience in description.

As shown in FIG. 1, any switches which are turned on or off in response to electrical signals, such as the internal error signals err_a to err_c and the no_error signal no_err input to the four switches, are used as the four switches 54a to 54d. For example, transistors which electrically connect the nodes connected to both ends of the switches to each other by being turned on when the electrical signals have high potentials (H), and which electrically disconnect the nodes connected to both the ends of the switches by being turned off when the electrical signals have low potentials (L), for example, n-channel type MOS transistors, may be used as the switches 54a to 54d.

Gates of the switches 54a to 54c are respectively connected to the corresponding abnormality detectors 10a to 10c. The internal error signals err_a to err_c from the abnormality detectors 10a to 10c are used gate control signals, and thus, the electrical connection states of both the ends of the switches 54a to 54c, that is, the turned-on or -off states, are controlled. One end of the switches 54a, 54b, and 54c is electrically connected to the nodes Na, Nb, and Nc, respectively. The other end of the switches 54a to 54c is electrically connected to the common output terminal 40.

A gate of the switch 54d is connected to the no_error detector 20. One end of the switch 54d is electrically connected to the node Nd. The other end of the switch 54d is electrically connected to the common output terminal 40. The no_error signal no_err is used as the gate control signal, and thus, the electrical connection state of both the ends of the switch 54d, that is, the turned-on or -off state, is controlled.

When the switch 54a is turned on, the common output terminal 40 short-circuits with the node Na. The same voltage (reference voltage Vref_a) as the voltage of the node Na is applied to the common output terminal 40. When the switch 54b is turned on, the common output terminal 40 short-circuits with the node Nb. The same voltage (reference voltage Vref_b) as the voltage of the node Nb which is obtained by the voltage drop of the power supply potential VDD by the resistor 53a is applied to the common output terminal 40. When the switch 54c is turned on, the common output terminal 40 short-circuits with the node Nc. The same voltage (reference voltage Vref_c) as the voltage of the node Nc, which is obtained by the voltage drop of the power supply potential VDD by the resistors 53a and 53b, is applied to the common output terminal 40. When the switch 54d is turned on, the common output terminal 40 short-circuits with the node Nd. The same voltage (reference voltage Vref_d) as the voltage of the node Nd which is obtained by the voltage drop of the power supply potential VDD by the resistors 53a to 53c is applied to the common output terminal 40.

As stated above, the reference voltage output circuit 31 applies, as the reference voltage, any voltage of the reference voltages Vref_a to Vref_d to the common output terminal 40 in response to the internal error signals err_a to err_c from the abnormality detectors 10a to 10c and the no_error signal no_err from the no_error detector 20. The reference voltage is output as the error output signal ERR externally with respect to the semiconductor integrated circuit 100.

Figure 2:
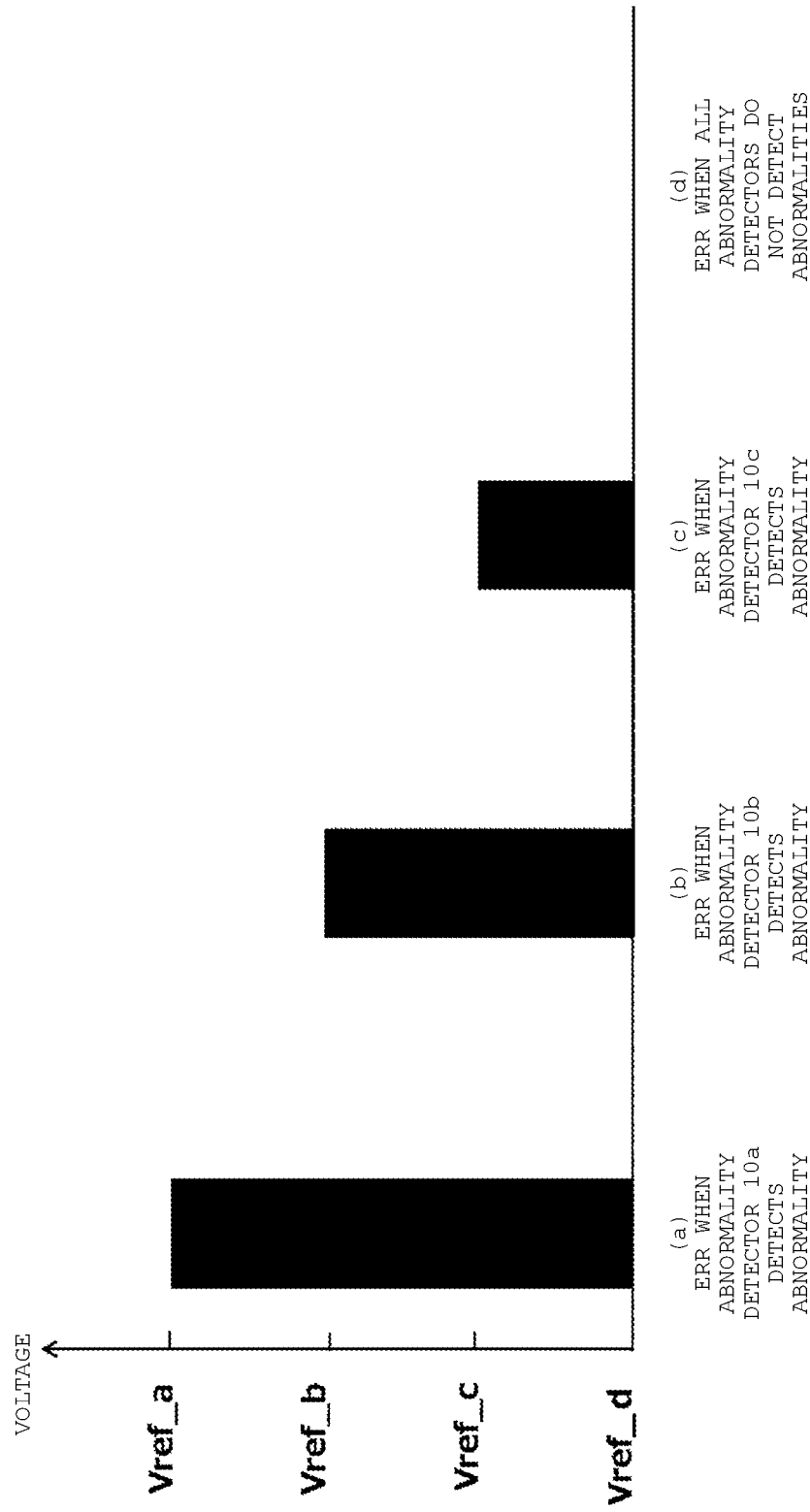
FIG. 2 is a diagram showing a voltage level of an error output signal ERR when an abnormality is detected in the semiconductor integrated circuit of the first embodiment.

FIG. 2 is a diagram for illustrating a voltage level of the error output signal ERR when each abnormality detector 10 detects the abnormality in the semiconductor integrated circuit 100 of the first embodiment. A vertical axis of FIG. 2 represents the voltage level of the error output signal ERR.

(a) When the abnormality detector 10a detects an abnormality, the output of the internal error signal err_a has a high potential (H). The outputs of the internal error signals err_b and err_c have low potentials (L). Since the output of the internal error signal has a high potential (H), the output of the no_error signal no_err, which is the negative logical sum of these signals, has a low potential (L). Accordingly, since the switches 54b, 54c, and 54d are turned off and the switch 54a is turned on, the reference voltage Vref_a is output as the error output signal ERR to the common output terminal 40.

(b) When the abnormality detector 10b detects an abnormality, the output of the internal error signal err_b has a high potential (H). The outputs of the internal error signals err_a and err_c have low potentials (L). Since the output of the internal error signal has a high potential (H), the output of the no_error signal no_err, which is the negative logical sum of these signals, has a low potential (L). Accordingly, since the switches 54a, 54c, and 54d are turned off and the switch 54b is turned on, the reference voltage Vref_b is output as the error output signal ERR to the common output terminal 40.

(c) When the abnormality detector 10c detects an abnormality, the output of the internal error signal err_c has a high potential (H). The outputs of the internal error signals err_a and err_b have low potentials (L). Since the output of the internal error signal has a high potential (H), the output of the no_error signal no_err, which is the negative logical sum of these signals, has a low potential (L). Accordingly, since the switches 54a, 54b, and 54d are turned off and the switch 54c is turned on, the reference voltage Vref_c is output as the error output signal ERR to the common output terminal 40.

(d) When none of the abnormality detectors 10a to 10c detect any abnormalities, all the outputs of the internal error signals err_a to err_c have low potentials (L), and the output of the no_error signal no_err, which is the negative logical sum thereof, has a high potential (H). Accordingly, since the switches 54a to 54c are turned off and the switch 54d is turned on, the reference voltage Vref_d is output as the error output signal ERR to the common output terminal 40.

As stated above, it is possible to detect whether or not an abnormality occurs for each system by monitoring the output state (reference voltage level) of the error output signal ERR through the common output terminal 40. Any method capable of determining the voltage of the error output signal ERR may be used as the monitoring method. For example, analog-to-digital converter may be used in the monitoring of the error output signal ERR.

The resistors 53a to 53c do not need to have the same resistance value, and may be set such that the reference voltages Vref_a to Vref_d have different values. For example, when the resistor 53c is R (R is a predetermined value), the resistor 53b has a resistance value of 2R, and the resistor 53a has a resistance value of 4R. In this manner, the resistance values may increase at a predetermined ratio.

As stated above, according to the semiconductor integrated circuit of the first embodiment, when any of the abnormality detectors 10a to 10c detects an abnormality, the abnormality detector 10 that detects the abnormality outputs any of the internal error signals err_a(H) to err_c(H). Any of the switches 54a to 54c that receives the internal error signal operates, and the reference voltage set as a value different for each abnormality detector 10 is output as the error output signal ERR from one common output terminal 40. When none of the abnormality detectors 10a to 10c detects an abnormality, the no_error detector 20 outputs the no_error signal no_err(H). The switch 54d that receives the no_error signal operates, and the error output signal ERR (in this example, the reference voltage Vref_d) indicating that there is no_error is output from the common output terminal.

As stated above, it is possible to determine whether or not the abnormality occurs for each system and it is also possible to determine which part of the system the abnormality occurs when there is the abnormality by monitoring the voltage level of the error output signal ERR through the common output terminal 40.

Second Embodiment

A semiconductor integrated circuit 200 of a second embodiment has the same configuration as the semiconductor integrated circuit 100 of the first embodiment, and a configuration of a reference voltage output circuit 32 is different from the configuration of the reference voltage output circuit 31. In the following description, the same functions or configurations as those of the semiconductor integrated circuit of the first embodiment will not be described for sake of brevity.

Figure 3:
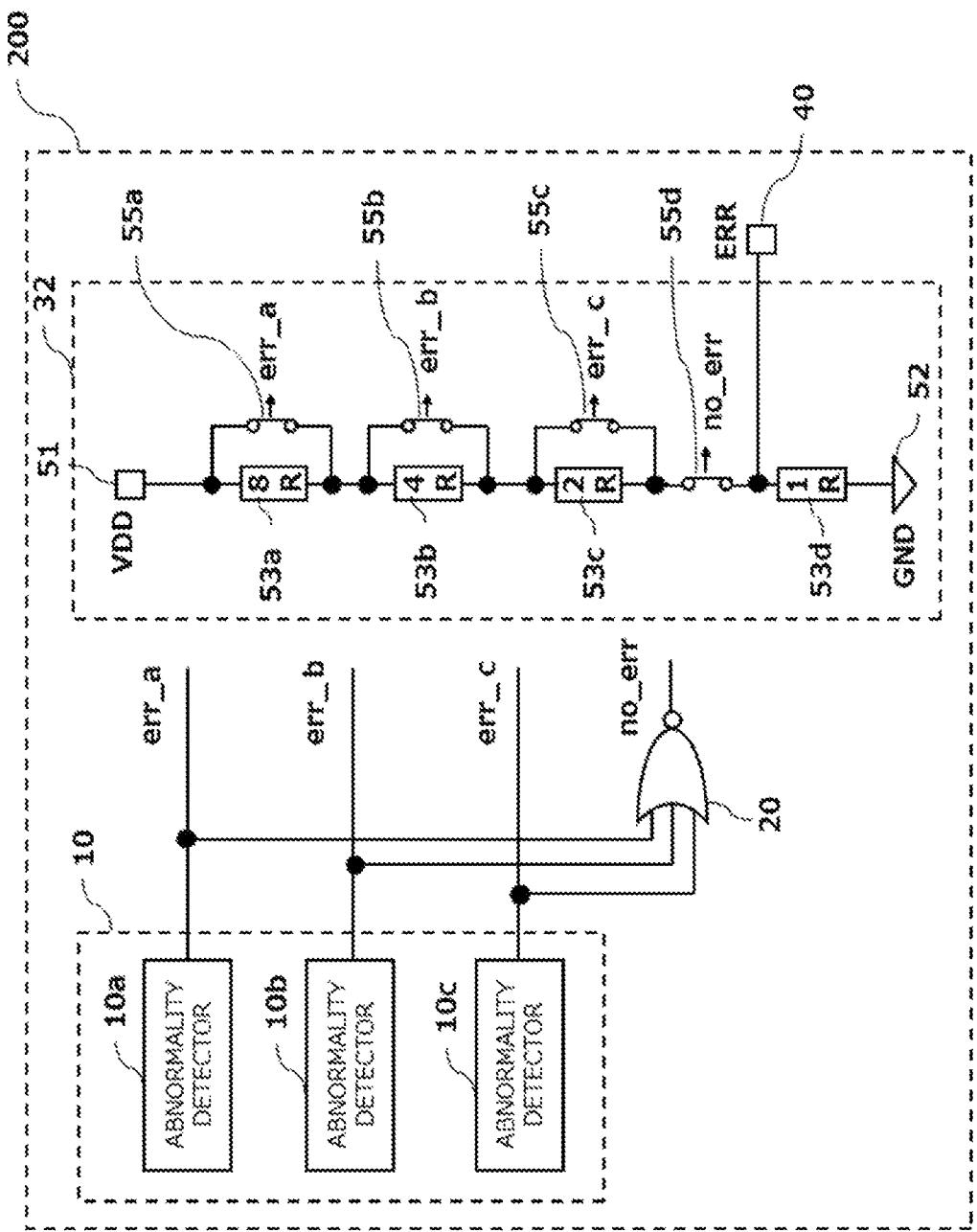
FIG. 3 is a schematic circuit diagram showing a configuration of a semiconductor integrated circuit of a second embodiment.

FIG. 3 is a schematic circuit diagram showing a configuration of the semiconductor integrated circuit 200 of the second embodiment. The semiconductor integrated circuit 200 includes the plurality of abnormality detectors 10a, 10b, and 10c, the no_error detector 20, the reference voltage output circuit 32, and the common output terminal 40. The reference voltage output circuit 32 includes four resistors 53a, 53b, 53c, and 53d, and four switches 55a, 55b, 55c, and 55d.

The four resistors 53a to 53d have different resistance values, and are set in advance such that the sum of resistance values of a plurality of randomly selected resistors 53 is different from the sum of resistance values of another resistor combination or resistance values of other resistors 53. For example, the resistor 53a has a resistance value of 8R (R is a predetermined value), the resistor 53b has a resistance value of 4R, the resistor 53c has a resistance value of 2R, and the resistor 53d has a resistance value of R. In this manner, the resistance values may decrease in order at a ratio of 1:2.

Gates of the switches 55a to 55c are electrically connected to the abnormality detectors 10a to 10c, respectively. The switches 55a to 55c use the internal error signals err_a to err_c as the gate control signals, and thus, the turned-on or -off state is controlled. The switch 55d is electrically connected to the no_error detector 20. The switch 55d uses the no_error signal no_err as the gate control signal, and thus, the turned-on or -off state is controlled.

When the internal error signals err_a to err_c and the no_error signal no_err are received, the switches 55a to 55d operate reversely to the switches 54a to 54d of the first embodiment described above. That is, the switches 55a to 55d electrically disconnect the nodes connected to both ends of the switches by being turned off when the outputs of the corresponding internal error signals err_a to err_c and the corresponding no_error signal no_err have high potentials (H), and electrically connect the nodes connected to both ends of the switches by being turned on when these signals have low potentials (L). Normally-on transistors or P-channel MOS transistors may be used as the switches 55a to 55d.

The resistor 53a, the resistor 53b, the resistor 53c, the switch 55d, and the resistor 53d are electrically connected in series between the power supply terminal 51 and the ground terminal 52.

The switches 55a to 55c are electrically connected to the resistors 53a to 53c in parallel at both the ends of the resistors 53a to 53c. When the switches 55a to 55c are turned off, the voltages are applied to the corresponding resistors 53a to 53c. When the switches 55a to 55c are turned on, both the ends of the corresponding resistors 53a to 53c have the same potential, and the voltages are not applied to the corresponding resistors 53a to 53c.

The common output terminal 40 is provided while being electrically connected to the node between the switch 55d and the resistor 53d. The voltage level applied to the common output terminal 40 is changed depending on which of the switches 55a to 55d is turned off.

Figure 4:
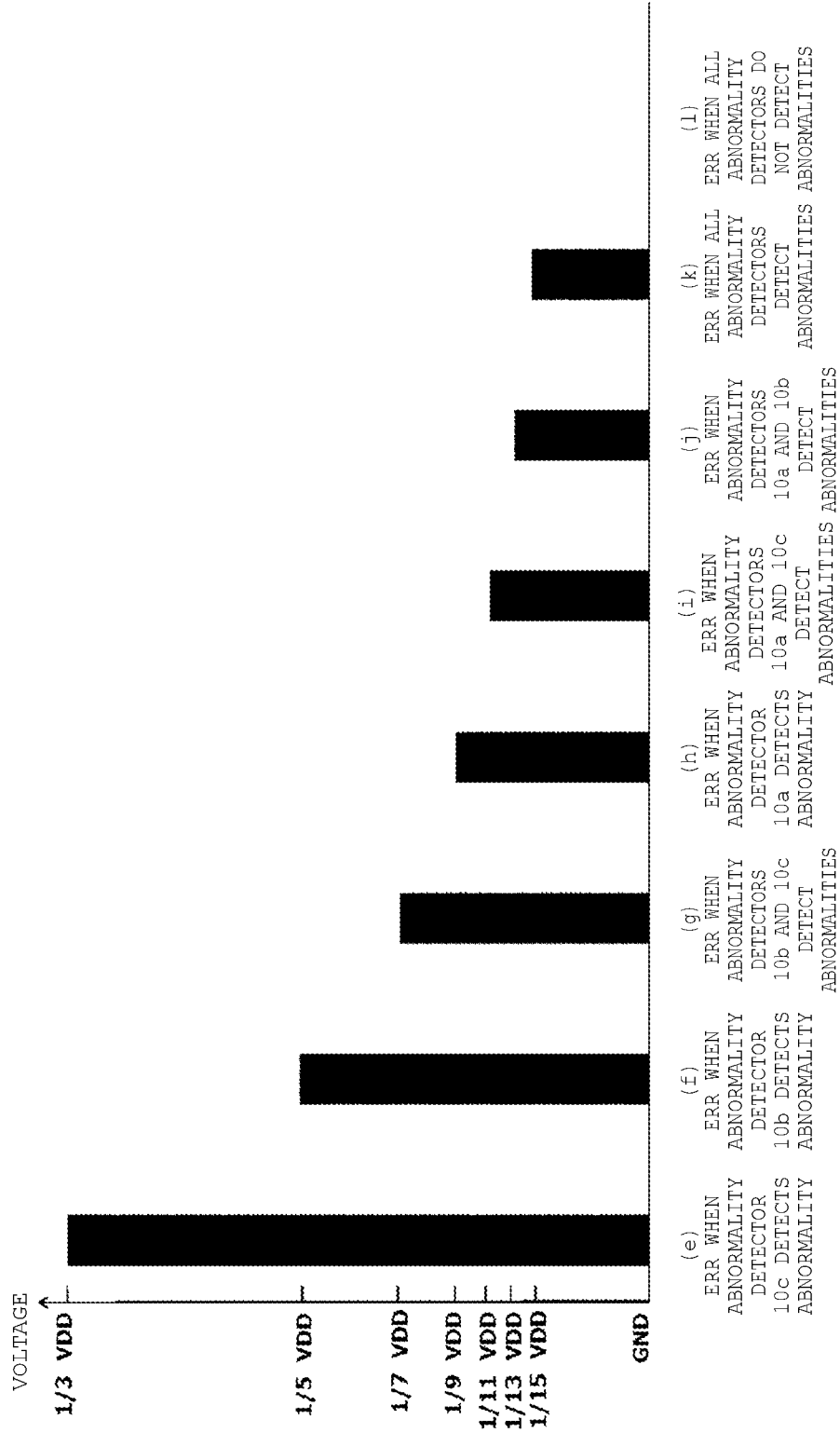
FIG. 4 is a diagram showing a voltage level of an error output signal ERR when an abnormality is detected in the semiconductor integrated circuit of the second embodiment.

FIG. 4 is a diagram showing the voltage level of the error output signal ERR depending on the combination of the abnormality detectors 10a to 10b that detect the abnormalities in the semiconductor integrated circuit 200 of the second embodiment. A vertical axis of FIG. 4 represents the voltage level of the error output signal ERR.

A voltage having a value corresponding to the combination of the abnormality detectors 10a to 10c that detect abnormalities is applied as the error output signal ERR to the common output terminal 40. The voltage of the error output signal ERR is expressed by an expression of VDD×{resistance value of resistor 53d/(sum of resistance values of resistors corresponding to abnormality detectors that detect abnormalities+resistance value of resistor 53d)}.

When only the abnormality detector 10c detects an abnormality, as shown by plot (e) in FIG. 4, the output of the internal error signal err_c has a high potential (H). The outputs of the internal error signals err_a and err_b have low potentials (L). Since the output of the internal error signal has a high potential (H), the output of the no_error signal no_err, which is the negative logical sum of these signals, has a low potential (L). The switches 55a, 55b, and 55d are turned on, and the switch 55c is turned off. A voltage of VDD×{1R/(2R+1R)}=1/3VDD is applied to the common output terminal 40, and is output as the error output signal ERR.

(f) When only the abnormality detector 10b detects an abnormality, the output of the internal error signal err_b has a high potential (H). The outputs of the internal error signals err_a and err_c have low potentials (L). Since the output of the internal error signal has a high potential (H), the output of the no_error signal no_err, which is the negative logical sum of these signals, has a low potential (L). The switches 55a, 55c, and 55d are turned on, and the switch 55b is turned off. A voltage of VDD×{1R/(4R+1R)}=1/5VDD is applied to the common output terminal 40, and is output as the error output signal ERR.

When two abnormality detectors 10b and 10c detect the abnormalities, as shown by plot (g) in FIG. 4, the outputs of the internal error signals err_b and err_c have high potentials (H). The output of the internal error signal err_a has a low potential (L). Since the output of the internal error signal has a high potential (H), the output of the no_error signal no_err, which is the negative logical sum of these signals, has a low potential (L). The switches 55a and 55d are turned on, and the switches 55b and 55c are turned off. A voltage of VDD×{1R/(4R+2R+1R)}=1/7VDD is applied to the common output terminal 40, and is output as the error output signal ERR.

When only the abnormality detector 10a detects the abnormality, as shown by plot (h) in FIG. 4, the output of the internal error signal err_a has a high potential (H). The outputs of the internal error signals err_b and err_c have low potentials (L). Since the output of the internal error signal has a high potential (H), the output of the no_error signal no_err, which is the negative logical sum of these signals, has a low potential (L). The switches 55b, 55c, and 55d are turned on, and the switch 55a is turned off. A voltage of VDD×{1R/(8R+1R)}=1/9VDD is applied to the common output terminal 40, and is output as the error output signal ERR.

(i) When two abnormality detectors 10a and 10c detect the abnormalities, the outputs of the internal error signals err_a and err_c have high potentials (H). The output of the internal error signal err_b has a low potential (L). Since the output of the internal error signal has a high potential (H), the output of the no_error signal no_err, which is the negative logical sum of these signals, has a low potential (L). The switches 55b and 55d are turned on, and the switches 55a and 55c are turned off. A voltage of VDD×{1R/(8R+2R+1R)}=1/11VDD is applied to the common output terminal 40, and is output as the error output signal ERR.

When two abnormality detectors 10a and 10b detect the abnormalities, as shown by plot (j) in FIG. 4, the outputs of the internal error signals err_a and err_b have high potentials (H). The output of the internal error signal err_c has a low potential (L). Since the output of the internal error signal has a high potential (H), the output of the no_error signal no_err, which is the negative logical sum of these signals, has a low potential (L). The switches 55c and 55d are turned on, and the switches 55a and 55b are turned off. A voltage of VDD×{1R/(8R+4R+1R)}=1/13VDD is applied to the common output terminal 40, and is output as the error output signal ERR.

When all the abnormality detectors 10a to 10c detect the abnormalities, as shown by plot (k) in FIG. 4, the outputs of the internal error signals err_a, err_b, and err_c have high potentials (H). Since the output of the internal error signal has a high potential (H), the output of the no_error signal no_err, which is the negative logical sum of these signals, has a low potential (L). The switch 55d is turned on, and the switches 55a, 55b, and 55c are turned off. A voltage of VDD×{1R/(8R+4R+2R+1R)}=1/15VDD is applied to the common output terminal 40, and is output as the error output signal ERR.

When all the abnormality detectors 10a to 10c do not detect the abnormalities, as shown by plot (l) in FIG. 4, all the outputs of the internal error signals err_a to err_c have low potentials (L), and the output of the no_error signal no_err, which is the negative logical sum thereof, has a high potential (H). The switches 55a to 55c are turned on, and the switch 55d is turned off. The ground potential GND is applied to the common output terminal 40, and is output as the error output signal ERR.

As stated above, according to the semiconductor integrated circuit of the second embodiment, when any of the abnormality detectors 10a to 10c detects an abnormality, any of the internal error signals err_a to err_c of any of the abnormality detectors 10a to 10c that detects the abnormality has a high potential (H), and any of the switches 55a to 55d that receives this internal error signal is turned off. The reference voltage having the value different for each combination of the abnormality detectors 10a to 10c that detects the abnormality is output as the error output signal ERR to the common output terminal 40. It is possible to determine whether or not one or more abnormalities occurs in the system and it is also possible to determine which part of the system each abnormality occurs by monitoring the voltage level of the error output signal ERR output from the common output terminal 40.

Third Embodiment

A semiconductor integrated circuit of a third embodiment has substantially the same configuration as the semiconductor integrated circuit of the first embodiment, and is different from the semiconductor integrated circuit of the first embodiment in that the reference voltage output circuit 31 is not provided and a sink current generation unit 33 is provided. In the following description, the same functions or configurations of those of the semiconductor integrated circuit of the first embodiment will not be described for sake of brevity.

Figure 5:
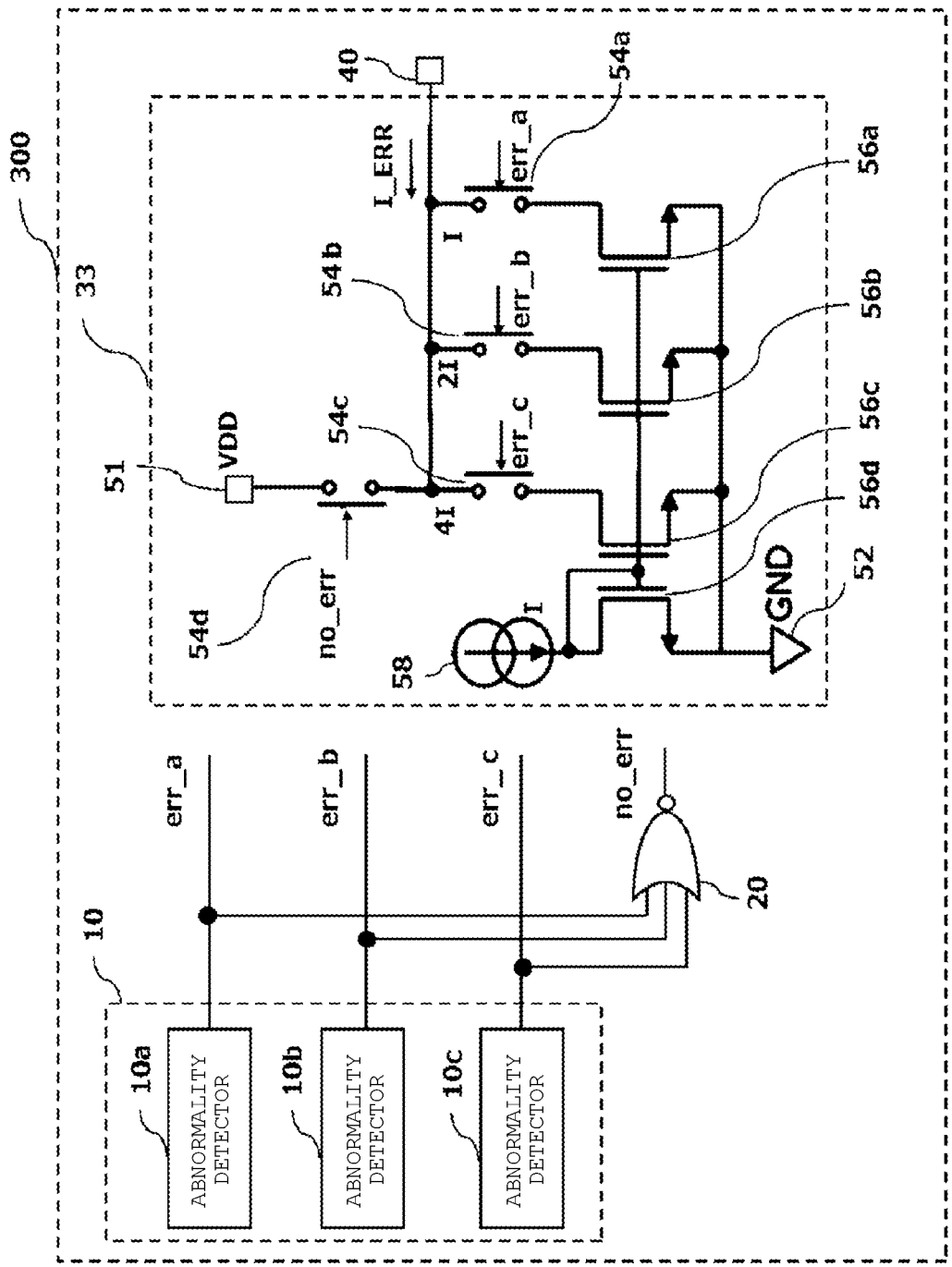
FIG. 5 is a schematic circuit diagram showing a configuration of a semiconductor integrated circuit of a third embodiment.

FIG. 5 is a schematic circuit diagram showing a configuration of a semiconductor integrated circuit 300 of the third embodiment. The semiconductor integrated circuit 300 includes the abnormality detectors 10a, 10b, and 10c, the no_error detector 20, the sink current generation unit 33, and the common output terminal 40.

The sink current generation unit includes four switches 54a, 54b, 54c, and 54d, and four n-channel MOSFETs 56a, 56b, 56c, and 56d.

Gates of the switches 54a to 54c are connected to the abnormality detectors 10a to 10c, respectively. The switches 54a to 54c are turned on when the internal error signals err_a to err_c have high potentials (H), and are turned off when the internal error signals err_a to err_c have low potentials (L). A gate of the switch 54d is connected to the no_error detector 20. The switch 54d is turned on when the no_error signal no_err has a high potential (H), and is turned off when the no_error signal has a low potential (L).

Sources and drains of the n-channel MOSFETs 56a, 56b, and 56c are electrically connected in parallel between the power supply terminal 51 and the ground terminal 52. The switch 54d is electrically connected between the n-channel MOSFETs 56a to 56c connected in parallel and the power supply terminal 51. The switch 54a is electrically connected between the switch 54d and the n-channel MOSFET 56a. The switch 54b is electrically connected in series between the switch 54d and the n-channel MOSFET 56b. The switch 54c is electrically connected in series between the switch 54d and the n-channel MOSFET 56c. The common output terminal 40 is electrically connected to the node between the switch 54d and the switch 54a.

The n-channel MOSFET 56d is connected between a current source 58 and the ground terminal 52. The current source 58 is electrically connected to gates of the n-channel MOSFETs 56a to 56d. The current source 58 applies a source-drain current of I to the n-channel MOSFET 56d.

The circuit arrangement of the n-channel MOSFETs 56a to 56d is equivalent to a current mirror circuit, and source-drain currents of the n-channel MOSFETs 56a to 56c have values different from each other when the same gate-source voltage is applied to these MOSFETS. The sum of source-drain currents of a plurality of randomly selected n-channel MOSFETs 56a to 56c is set so as not to have the same value as the sum of source-drain currents of another MOSFET combination and values of source-drain currents of other MOSFETS. For example, when the source-drain current of I is applied to the n-channel MOSFET 56d, the n-channel MOSFETs 56a, 56b, and 56c may be selected such that current values are different from each other at a ratio of 1:2. In this case, for example, a source-drain current of I is applied to the n-channel MOSFET 56a, a source-drain current of 2I is applied to the n-channel MOSFET 56b, and a source-drain current of 4I is applied to the n-channel MOSFET 56c.

As stated above, in the semiconductor integrated circuit 300 of the third embodiment, a value of a sink current output from the common output terminal 40 is different depending on which of the abnormality detectors 10a to 10c detects an abnormality.

Figure 6:
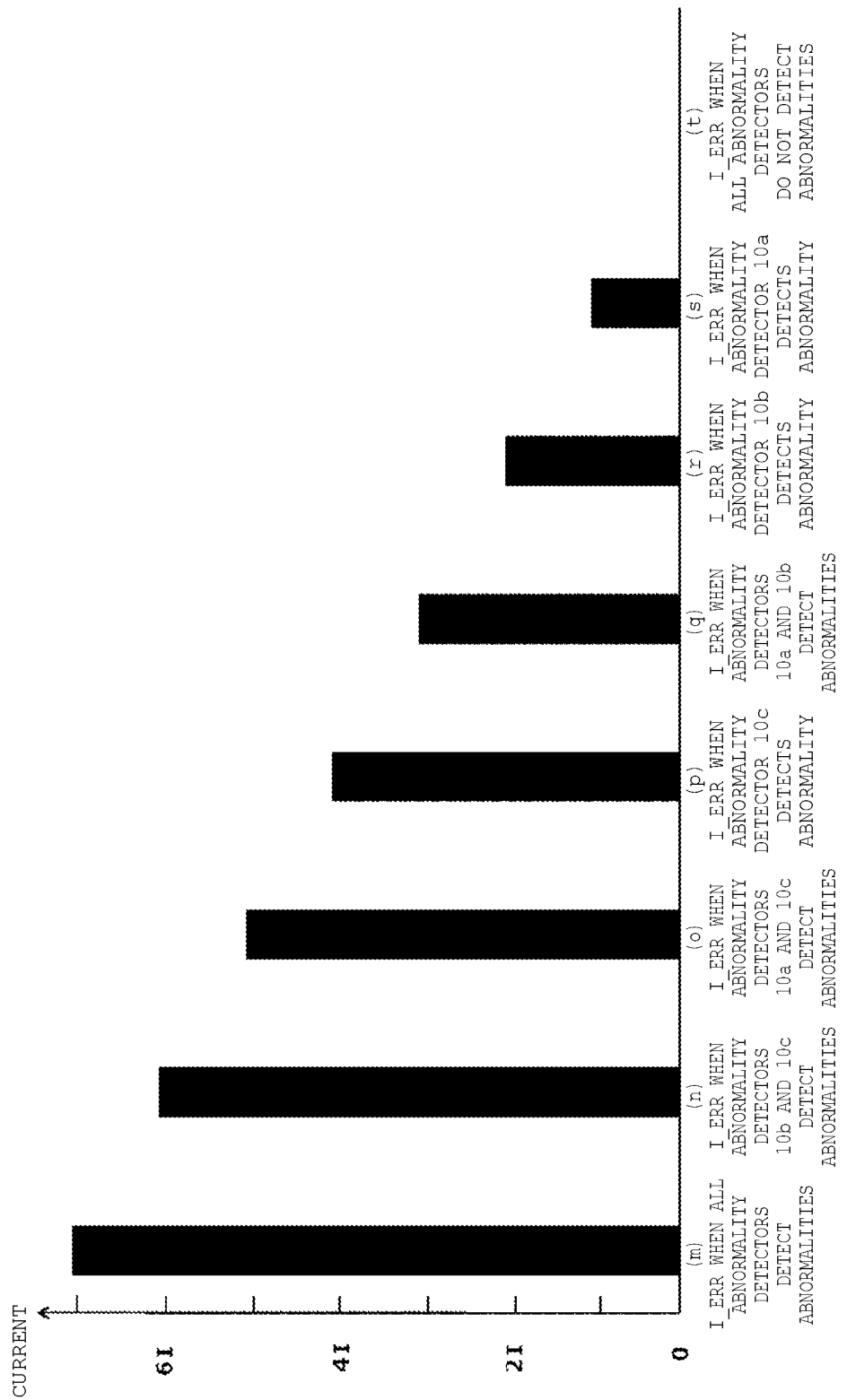
FIG. 6 is a diagram showing a current level of an error output signal I_ERR when an abnormality is detected in the semiconductor integrated circuit of the third embodiment.

FIG. 6 is a diagram showing a current level of an error output signal I_ERR depending on the combination of the abnormality detectors 10a to 10c that detect the abnormalities in the semiconductor integrated circuit 300 of the third embodiment. A vertical axis of FIG. 6 represents the current level of the error output signal I_ERR.

When all the abnormality detectors 10a to 10c detect the abnormalities, as shown by plot (m) in FIG. 6, the outputs of the internal error signals err_a, err_b, and err_c have high potentials (H). Since the output of the internal error signal has a high potential (H), the output of the no_error signal no_err, which is the negative logical sum of these signals, has a low potential (L). The switch 54d is turned off, and the switches 54a, 54b, and 54c are turned off. A sink current of (4I+2I+I)=7I is applied to the common output terminal 40, and is output as the error output signal I_ERR.

(n) When two abnormality detectors 10b and 10c detect the abnormalities, the outputs of the internal error signals err_b and err_c have high potentials (H). The output of the internal error signal err_a has a low potential (L). Since the output of the internal error signal has a high potential (H), the output of the no_error signal no_err, which is the negative logical sum of these signals, has a low potential (L). The switches 54a and 54d are turned off, and the switches 54b and 54c are turned on. A sink current of (4I+2I)=6I is applied to the common output terminal 40, and is output as the error output signal I_ERR.

When two abnormality detectors 10a and 10c detect the abnormalities, as shown by plot (o) in FIG. 6, the outputs of the internal error signals err_a and err_c have high potentials (H). The output of the internal error signal err_b has a low potential (L). Since the output of the internal error signal has a high potential (H), the output of the no_error signal no_err, which is the negative logical sum of these signals, has a low potential (L). The switches 54b and 54d are turned off, and the switches 54a and 54c are turned on. A sink current of (4I+I)=5I is applied to the common output terminal 40, and is output as the error output signal I_ERR.

When only the abnormality detector 10c detects the abnormality, as shown by plot (p) in FIG. 6, the output of the internal error signal err_c has a high potential (H). The outputs of the internal error signals err_a and err_b have low potentials (L). Since the output of the internal error signal has a high potential (H), the output of the no_error signal no_err, which is the negative logical sum of these signals, has a low potential (L). The switches 54a, 54b, and 54d are turned off, and the switch 54c is turned on. A sink current of 4I is applied to the common output terminal 40, and is output as the error output signal I_ERR.

When two abnormality detectors 10a and 10b detect the abnormalities, as shown by plot (q) in FIG. 6, the outputs of the internal error signals err_a and err_b have high potentials (H). The output of the internal error signal err_c has a low potential (L). Since the output of the internal error signal has a high potential (H), the output of the no_error signal no_err, which is the negative logical sum of these signals, has a low potential (L). The switches 54c and 54d are turned off, and the switches 54a and 54b are turned on. A sink current of (2I+I)=3I is applied to the common output terminal 40, and is output as the error output signal I_ERR.

When only the abnormality detector 10*b* detects the abnormality, as shown by plot (r) in FIG. 6, the output of the internal error signal err_b has a high potential (H). The outputs of the internal error signals err_a and err_c have low potentials (L). Since the output of the internal error signal has a high potential (H), the output of the no_error signal no_err, which is the negative logical sum of these signals, has a low potential (L). The switches 54*a*, 54*c*, and 54*d* are turned off, and the switch 54*b* is turned on. A sink current of 2I is applied to the common output terminal 40, and is output as the error output signal I_ERR.

When only the abnormality detector 10*a* detects the abnormality, as shown by plot (s) in FIG. 6, the output of the internal error signal err_a has a high potential (H). The outputs of the internal error signals err_b and err_c have low potentials (L). Since the output of the internal error signal has a high potential (H), the output of the no_error signal no_err, which is the negative logical sum of these signals, has a low potential (L). The switches 54*b*, 54*c*, and 54*d* are turned off, and the switch 54*a* is turned on. A sink current of I is applied to the common output terminal 40, and is output as the error output signal I_ERR.

When all the abnormality detectors 10*a* to 10*c* do not detect the abnormalities, as shown by plot (t) in FIG. 6, all the outputs of the internal error signals err_a to err_c have low potentials (L), and the output of the no_error signal no_err which is the negative logical sum thereof has a high potential (H). The switches 54*a* to 54*c* are turned off, and the switch 54*d* is turned on. The switch 54*d* pulls up the signal input to the common output terminal 40, and thus, the power supply potential VDD is applied to the common output terminal 40. While the example in which the error output signal I_ERR is output as zero is illustrated in FIG. 6, the error output signal I_ERR when the output of the no_error signal no_err has a high potential (H) may be set as any value different from the error output signal I_ERR at the time of detecting the abnormality.

It is possible to detect which part of the system an abnormality occurs by monitoring the output state of the error output signal I_ERR (sink current level) through the common output terminal 40. Even though a plurality of abnormalities simultaneously occurs, it is possible to detect which part of the system which abnormality occurs by determining which combination of the abnormalities the current of the error output signal I_ERR is generated.

Figure 7:
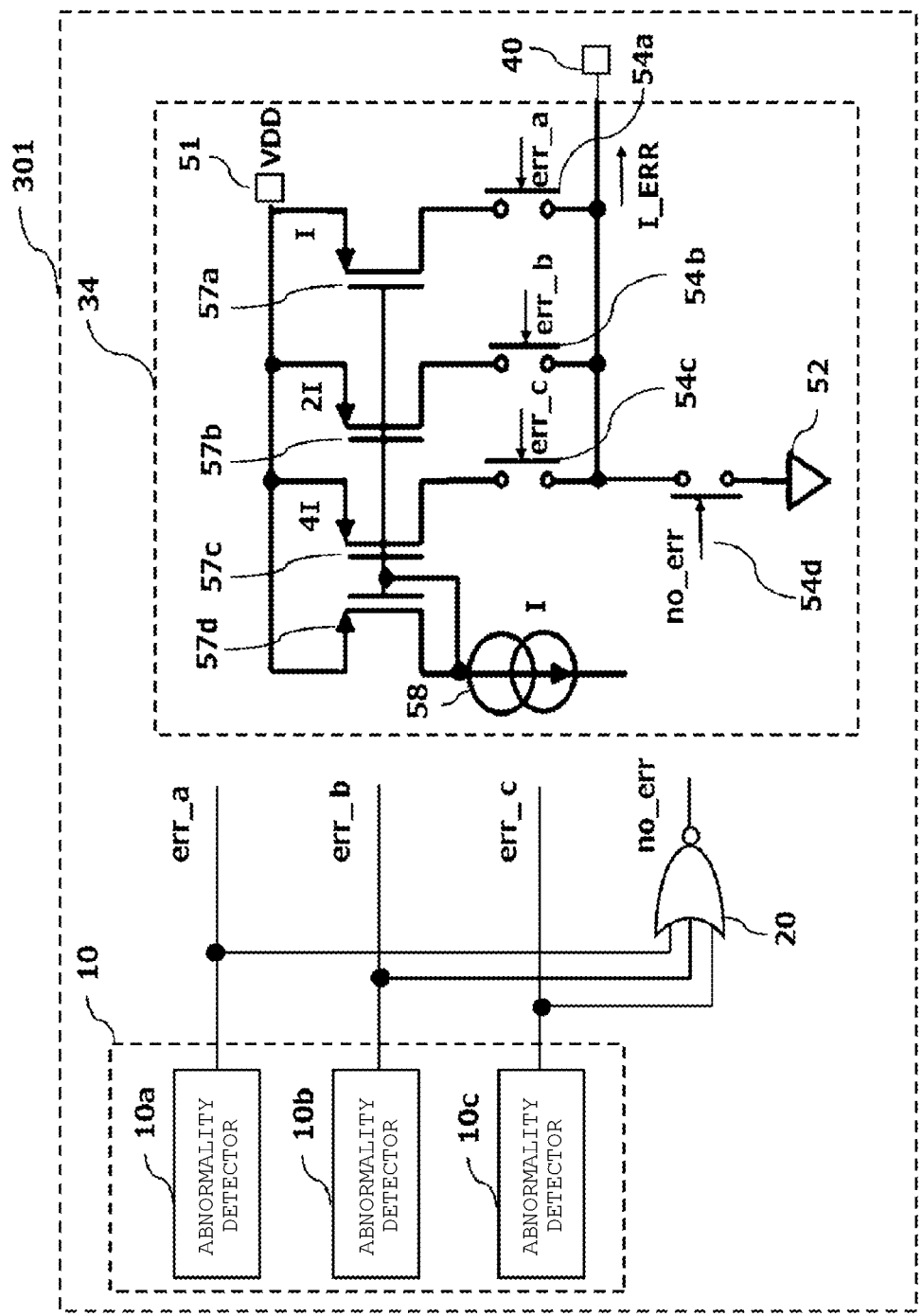
FIG. 7 is a schematic circuit diagram showing a configuration of a semiconductor integrated circuit of a modification of the third embodiment.

While the example in which the error output signal I_ERR is the sink current is illustrated in FIG. 5, the error output signal I_ERR may be a source current. For example, such an embodiment may be implemented by a semiconductor integrated circuit 301 shown in FIG. 7. FIG. 7 is a schematic circuit diagram showing a configuration of a semiconductor integrated circuit 301 of a modification of the third embodiment. In the semiconductor integrated circuit 301 of the modification of the third embodiment, the source current generation unit 34 is provided instead of the sink current generation unit 33. The channel type of the MOSFET or the location in which the common output terminal 40 is provided are different between the sink current generation unit 33 and the source current generation unit 34.

As mentioned above, according to the semiconductor integrated circuit of the third embodiment, when any of the abnormality detectors 10*a* to 10*c* detects an abnormality, any of the internal error signals err_a to err_c corresponding to any of the abnormality detectors 10*a* to 10*c* that detects the abnormality has a high potential. Any of the n-channel MOSFETs 56*a* to 56*c* that receives the internal error signal operates. The current set as a value different for each combination of the abnormality detectors 10*a* to 10*c* that detects the abnormality is output as the error output signal I_ERR to the common output terminal 40. It is possible to determine that one or more abnormalities occur in the system and it is possible to determine which part of the system each abnormality occurs by monitoring the current level of the error output signal I_ERR output from the common output terminal 40.

Fourth Embodiment

A semiconductor integrated circuit of a fourth embodiment has substantially the same configuration as the semiconductor integrated circuit of the first embodiment, and is different from the semiconductor integrated circuit of the first embodiment in that the reference voltage output circuit 32 is not provided and an oscillator 35 is provided. In the following description, the same functions or configurations of those of the semiconductor integrated circuit of the first embodiment will not be described.

Figure 8:
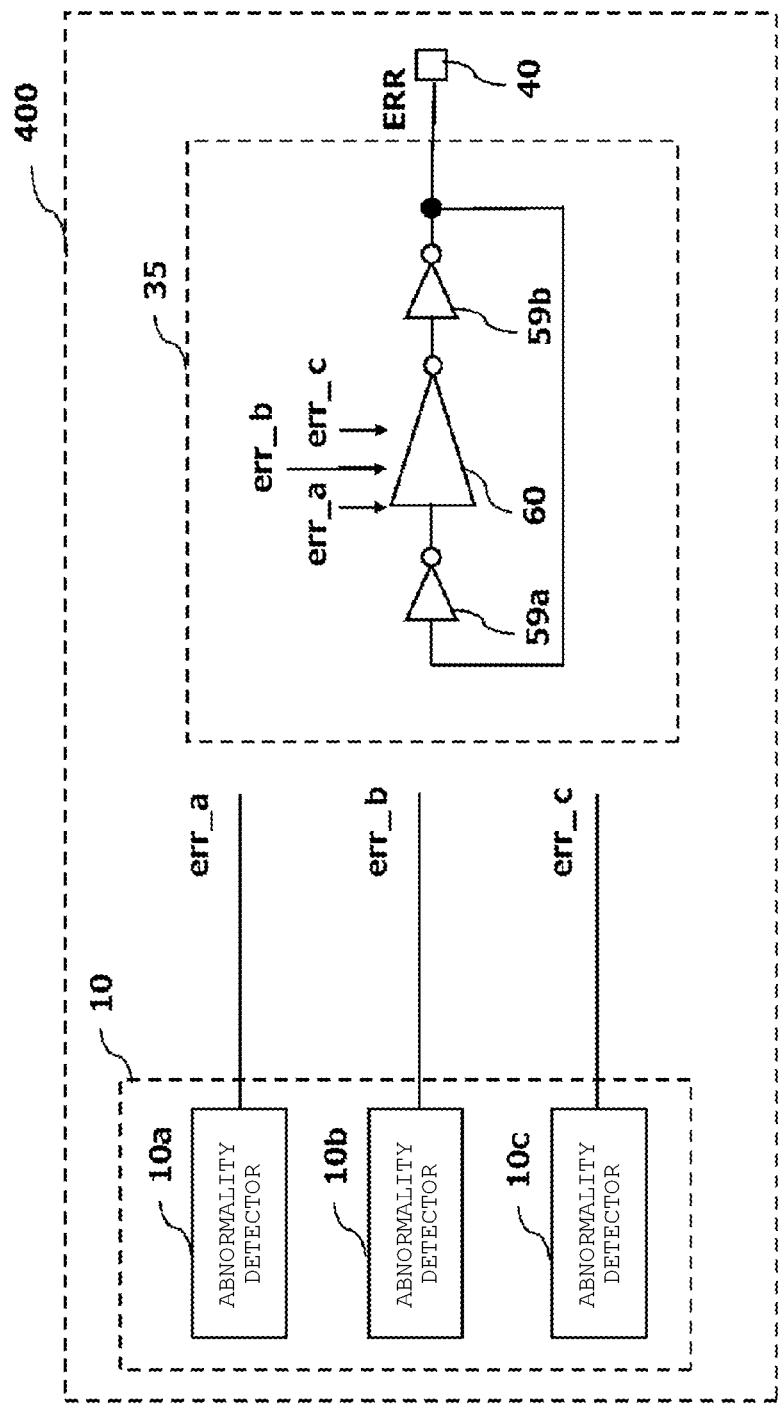
FIG. 8 is a schematic circuit diagram showing a configuration of a semiconductor integrated circuit of a fourth embodiment.

FIG. 8 is a schematic circuit diagram showing a configuration of a semiconductor integrated circuit 400 of the fourth embodiment. The semiconductor integrated circuit 400 includes the abnormality detectors 10*a*, 10*b*, and 10*c*, the oscillator 35, and the common output terminal 40.

The oscillator 35 is an oscillation circuit that generates an alternating current signal, and oscillates in an oscillation frequency (period) different for each input internal error signal. The oscillator 35 may have any oscillation circuit capable of setting the oscillation frequency to be variable in response to the inputs of the internal error signals err_a to err_c. For example, the oscillator 35 may be implemented by a ring oscillator configured such that a plurality of logic gates is connected in a ring shape shown in FIG. 8.

The oscillator 35 is a ring oscillator including inverters 59*a*, 59*b* and 60, and the common output terminal 40 is electrically connected to a node between the inverter 59*b* and the inverter 59*a*. The oscillator 35 alternately outputs a binary number of a high potential (H) and a low potential (L) to the common output terminal 40.

A delay time of the inverter 60 is controlled in response to the internal error signals err_a to err_c. The inverter 60 has a delay time different for each of the input internal error signals err_a to err_c. For example, it is possible to adjust the delay time by adjusting a power supply voltage of the inverter 60. The reference voltage output circuit 31 may be provided in the semiconductor integrated circuit 400 in order to adjust the power supply voltage of the inverter 60.

The inverters 59*a*, 59*b*, and 60 have specific delay times. Thus, an output of logical negation is repeated with the delay times of the inverters 59*a*, 59*b* and 60 as one period, and thus, the oscillator 35 oscillates. Since the delay time of the inverter 60 is adjusted by the internal error signals err_a to err_c, the oscillator 35 can adjust the frequency (period) of the oscillating alternating current signal.

Figure 9:
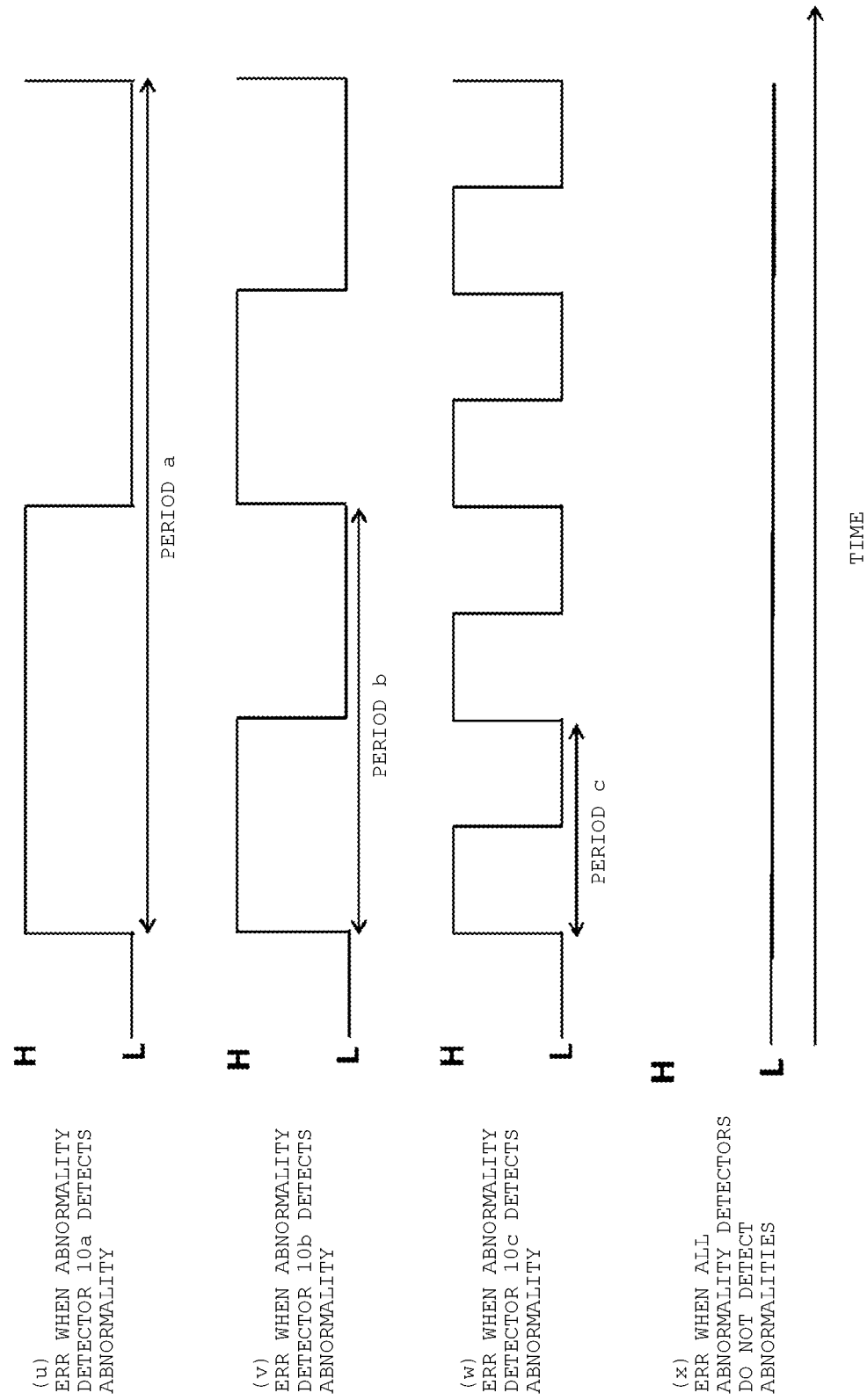
FIG. 9 is a diagram showing an error output signal ERR when an abnormality is detected in the semiconductor integrated circuit of the fourth embodiment.

FIG. 9 is a diagram showing the error output signal ERR when each abnormality detector 10 detects the abnormality in the semiconductor integrated circuit 400 of the fourth embodiment. A vertical axis of FIG. 9 represents a potential of the error output signal ERR, and a horizontal axis represents a time.

When the abnormality detector 10*a* detects an abnormality, as shown by time chart (u) in FIG. 9, the delay time of the inverter 60 is controlled in response to the internal error signal err_a(H), and the oscillator 35 applies an alternating current signal oscillating for a period a to the common output terminal 40. The alternating current signal oscillating for the period a is output as the error output signal ERR.

When the abnormality detector 10b detects an abnormality, as shown by time chart (v) in FIG. 9, the delay time of the inverter 60 is controlled in response to the internal error signal err_b(H), and the oscillator 35 applies an alternating current signal oscillating for a period b to the common output terminal 40. The alternating current signal oscillating for the period b is output as the error output signal ERR.

When the abnormality detector 10c detects an abnormality, as shown by time chart (w) in FIG. 9, the delay time of the inverter 60 is controlled in response to the internal error signal err_c(H), and the oscillator 35 applies an alternating current signal oscillating for a period c to the common output terminal 40. The alternating current signal oscillating for the period c is output as the error output signal ERR.

When none of the abnormality detectors 10a to 10c detect the abnormalities, as shown by time chart (x) in FIG. 9, the power supply voltage of the inverter 60 becomes zero, and the oscillator 35 does not oscillate. For example, the error output signal ERR continues to output a low potential (L).

The semiconductor integrated circuit 400 of the fourth embodiment may further include the no_error detector 20 in order to control the oscillation of the oscillator 35. For example, the output of the no_error detector 20 may be connected to an enable terminal provided at a power supply circuit that applies the power supply voltage to any inverter. When none of the abnormality detectors 10a to 10c detect abnormalities and a value of the no_error signal no_err input to the enable terminal has a high potential (H), the power supply circuit does not apply the power supply voltage to the inverter. Accordingly, the inverter does not operate, and the oscillator 35 does not oscillate. When any of the abnormality detectors 10a to 10c detects an abnormality and the value of the no_error signal no_err input to the enable terminal has a low potential (L), the power supply circuit of the inverter applies the power supply voltage. Accordingly, the inverter operates, and the oscillator 35 oscillates.

While the example in which the period a, the period b, and the period c are changed at a ratio of 1:2 is illustrated in FIG. 9, these periods may be set so as to have any values different from each other.

It is possible to detect which part of the system the abnormality occurs by monitoring the output state (frequency) of the error output signal ERR through the common output terminal 40. A method of determining the kinds of errors by emitting an LED in response to the error output signal ERR and visually checking an emission interval may be used as the monitoring method.

When the ring oscillator is used as the oscillator 35 of the fourth embodiment, the inverters constituting the oscillator 35 may be different in number than the three inverters 59a, 59b, and 60 shown in FIG. 8. Since the circuit can oscillate as long as the number of stages of inverters constituting the circuit is an odd number, it is possible to increase the number of stages of the inverters. The number of inverters of which the delay times are variable, which are provided in the oscillator 35, is not limited to one, and two or more inverters of which the delay times are variable may be provided in the oscillator 35.

As mentioned above, according to the semiconductor integrated circuit of the fourth embodiment, when any of the abnormality detectors 10a to 10c detects an abnormality, any of the internal error signals err_a to err_c corresponding to any of the abnormality detectors 10a to 10c that detects the abnormality has a high potential (H). The oscillator 35 that receives the internal error signal outputs, as the error output signal ERR, the alternating current signal set to have a frequency different for each of the abnormality detectors 10a to 10c that detects the abnormality to the common output terminal 40. It is possible to determine that an abnormality occurs in the system and it is possible to determine which part of the system the abnormality occurs by monitoring the frequency of the error output signal ERR output from the common output terminal 40.

Fifth Embodiment

A semiconductor integrated circuit of a fifth embodiment has substantially the same configuration as the semiconductor integrated circuit of the fourth embodiment, and a configuration of an oscillator 36 is different. In the following description, the same functions or configurations as those of the semiconductor integrated circuit of the fourth embodiment will not be described.

Figure 10:
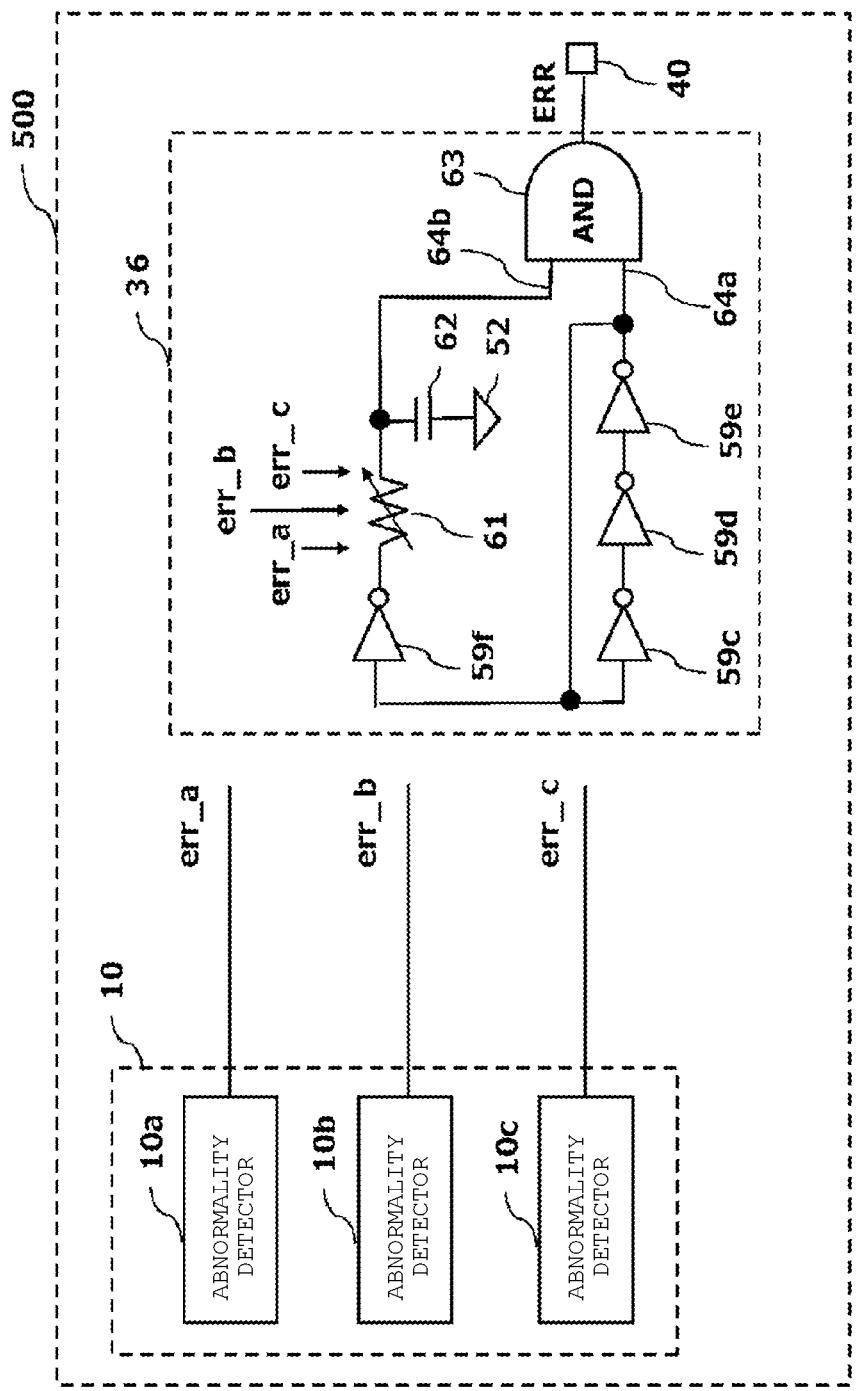
FIG. 10 is a schematic circuit diagram showing a configuration of a semiconductor integrated circuit of a fifth embodiment.

FIG. 10 is a schematic circuit diagram showing a configuration of a semiconductor integrated circuit 500 of the fifth embodiment. The semiconductor integrated circuit 500 includes the abnormality detectors 10a, 10b, and 10c, the oscillator 36, and the common output terminal 40.

The oscillator 36 is an oscillation circuit that generates an alternating current signal, and oscillates at a duty ratio different for each kind of the detected abnormality. The duty ratio is a ratio obtained by dividing a pulse width of the alternating current signal by a period thereof. The oscillator 36 may have any oscillation circuit capable of setting the duty ratio to be variable in response to the input of the internal error signal err. For example, the oscillator 36 may be implemented by the configuration in which the ring oscillator shown in FIG. 10 is used, and alternately outputs binary potentials of a high potential (H) and a low potential (L).

The oscillator 36 includes inverters 59c, 59d, 59e, and 59f, a variable resistor 61, a capacitor 62, and a logical sum circuit 63.

The inverters 59c to 59e constitute the ring oscillator. Nodes between the inverter 59e and the inverter 59c are electrically connected to an input of the inverter 59f and an input terminal 64a of the logical sum circuit 63. An output of the inverter 59f is electrically connected to one end of the variable resistor 61, and the other end of the variable resistor 61 is electrically connected to an input terminal 64b of the logical sum circuit 63. One end of the capacitor 62 is grounded, and the other end is electrically connected between the variable resistor 61 and the logical sum circuit 63. An output of the logical sum circuit 63 is electrically connected to the common output terminal 40.

A resistance value of the variable resistor 61 is set as a value different for each of the input internal error signals err_a to err_c.

The inverters 59c to 59e constitute the ring oscillator, and output alternating current signals oscillating in predetermined frequencies determined by the delay times thereof to the input terminal 64a of the logical sum circuit 63 and the inverter 59f.

An alternating current signal of the ring oscillator is input to the inverter 59f. After a predetermined time elapses from the input of the signal, the inverter 59f inverts the input signal, and outputs the inverted signal to the variable resistor 61. The variable resistor 61 may control a time taken to charge or discharge the capacitor 62 by adjusting the resistance value.

FIG. 11 is a diagram showing the error output signal ERR when each abnormality detector 10 detects the abnormality in the semiconductor integrated circuit 500 of the fifth embodiment. A vertical axis of FIG. 11 represents a voltage of the error output signal ERR, and a horizontal axis represents a time.

The signal input to the logical sum circuit 63 through the input terminal 64a and the signal input to the logical sum circuit 63 through the input terminal 64b oscillate in the same frequency. Rising and falling timings of the signals are different due to the time taken to charge or discharge of the capacitor 62 and the delay time of the inverter 59f between the signal input to the logical sum circuit 63 through the input terminal 64a and the signal input to the logical sum circuit 63 through the input terminal 64b. The logical sum circuit 63 uses the logical sum of these two signals, and thus, the oscillator 36 has the same frequency (period) as the ring oscillator in the oscillator. An alternating current signal having a pulse width different from these two signals is output as the error output signal ERR to the common output terminal 40. The pulse width of the alternating current signal output from the logical sum circuit 63 is changed, and thus, the duty ratio of the error output signal ERR is adjusted.

As stated above, the resistance value of the variable resistor 61 and the time taken to charge to discharge the capacitor 62 are controlled in response to the internal error signals err. The duty ratio of the output signal of the oscillator 36 is adjusted by using the logical sum of the two signals of which the rising and falling timings are different depending on the charging or discharging of the capacitor 62.

When the abnormality detector 10a detects an abnormality, as shown by time chart (a') in FIG. 11, the resistance value of the variable resistor 61 is controlled in response to the internal error signal err_a, and the oscillator 36 applies the alternating current signal oscillating at the duty ratio (pulse width a/period d) to the common output terminal 40, and outputs the alternating current signal as the error output signal ERR.

When the abnormality detector 10b detects an abnormality, as shown by time chart (b') in FIG. 11, the resistance value of the variable resistor 61 is controlled in response to the internal error signal err_b, and the oscillator 36 applies the alternating current signal oscillating at the duty ratio (pulse width b/period d) to the common output terminal 40, and outputs the alternating current signal as the error output signal ERR.

When the abnormality detector 10c detects an abnormality, as shown by time chart (c') in FIG. 11, the resistance value of the variable resistor 61 is controlled in response to the internal error signal err_c, and the oscillator 36 applies the alternating current signal oscillating at the duty ratio (pulse width c/period d) to the common output terminal 40, and outputs the alternating current signal as the error output signal ERR.

When none of the abnormality detectors 10a to 10c detect any abnormalities, as shown by time chart (d') in FIG. 11, the power supply voltage of the inverter 60 becomes zero, and the oscillator 36 does not oscillate. For example, the error output signal ERR continues to output a low potential (L).

The semiconductor integrated circuit 500 of the fifth embodiment may further include the no_error detector 20 in order to control the oscillation of the oscillator 36. For example, the output of the no_error detector 20 may be connected to the enable terminal provided at the power supply circuit that applies the power supply voltage to any of the inverters 59c to 59e. When none of the abnormality detectors 10a to 10c detect any abnormalities and a value of the no_error signal no_err input to the enable terminal has a high potential (H), the power supply circuit does not apply the power supply voltage to the inverter. Accordingly, the inverter does not operate, and the oscillator 36 does not oscillate. When any of the abnormality detectors 10a to 10c detects an abnormality and the value of the no_error signal no_err input to the enable terminal is a low potential (L), the power supply circuit of the inverter applies the power supply voltage to the inverter. Accordingly, the inverter operates, and the oscillator 36 oscillates. The method of controlling the oscillation of the oscillator 36 is not limited to the control of the power supply voltage of any of the inverters 59c to 59e, and may be performed by controlling the output of the logical sum circuit 63.

While the example in which the pulse width a, the pulse width b, and the pulse width c are changed at a ratio of 1:2 is illustrated in FIG. 11, the pulse widths may be set as any values different from each other.

It is possible to detect which part of the system the abnormality occurs by monitoring the output state (duty ratio) of the error output signal ERR through the common output terminal 40.

As mentioned above, according to the fifth embodiment, when any of the abnormality detectors 10a to 10c detects the abnormality, any of the internal error signals err_a to err_c corresponding to any of the abnormality detectors 10a to 10c that detects the abnormality has a high potential (H). The oscillator 36 that receives the internal error signal outputs, as the error output signal ERR, the alternating current signal set at the duty ratio different for each abnormality detector to the common output terminal 40. It is possible to determine that an abnormality occurs in the system and it is possible to determine which part of the system the abnormality occurs by monitoring the duty ratio of the error output signal ERR output through the common output terminal 40.

The system as a target into which the semiconductor integrated circuit of each embodiment is incorporated is not particularly limited. The system may be applied to devices which are provided with a plurality of abnormality detectors such as mobile terminal such as smartphones and mobile personal computers (PC), various devices connected through IoT, and vehicles- and infrastructure-related motor control devices and are desired to know the detected abnormal situation. It is possible to prevent an accident to be caused by the abnormality from occurring by stopping the system at a point of time when the abnormality is detected by the semiconductor integrated circuit of the embodiment. Since it is possible to determine the occurred abnormality, it is possible to quickly cope with the abnormality. When the semiconductor integrated circuit is mounted in the device such as the mobile terminal, since the number of output terminals for detecting the abnormality is one, the present embodiment is particularly effective for reducing the size of the device.

According to at least one embodiment described above, it is possible to provide the semiconductor integrated circuit capable of determining the content of the abnormality occurring in the system by changing the output state of one common output terminal 40.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a first abnormality detector configured to detect a first abnormality in the semiconductor integrated circuit, and output a first detection signal;
   a second abnormality detector configured to detect a second abnormality in the semiconductor integrated circuit, and output a second detection signal;
   a reference voltage output circuit that includes a first resistor and a second resistor which are connected in series between a power supply terminal to which a power supply potential is to be applied and a ground terminal to which a ground potential is to be applied, a first switch having a first end electrically connected to a first node at a first end of the first resistor, a second end, and a gate electrically connected to an output of the first abnormality detector, and a second switch having a first end electrically connected to a second node at a first end of the second resistor and a second end of the first resistor, a second end, and a gate electrically connected to an output of the second abnormality detector, wherein the reference voltage output circuit is configured to output a reference voltage having one of a plurality of different values depending on conduction states of a plurality of switches of the reference voltage output circuit that include the first switch and the second switch; and
   an output terminal through which the reference voltage is to be output as an error signal.

2. The semiconductor integrated circuit according to claim 1, wherein
   the second end of the first switch is electrically connected to the output terminal, and
   the second end of the second switch is electrically connected to the output terminal.

3. The semiconductor integrated circuit according to claim 2, further comprising:
   a NOR circuit to which the first and second detection signals are supplied as inputs to the NOR circuit,
   wherein the reference voltage output circuit further includes a third switch having a first end electrically connected to a second end of the second resistor and the ground terminal, a gate electrically connected to an output of the NOR circuit, and a second end electrically connected to the output terminal.

4. The semiconductor integrated circuit according to claim 1, wherein
   the second end of the first switch is electrically connected to the second node, and
   the second end of the second switch is electrically connected to a third node which is at a second end of the second resistor.

5. The semiconductor integrated circuit according to claim 4, further comprising:
   a NOR circuit to which the first and second detection signals are supplied as inputs to the NOR circuit,
   wherein the reference voltage output circuit further includes a third switch having a first end electrically connected to the second end of the second resistor, a gate electrically connected to an output of the NOR circuit, and a second end electrically connected to the output terminal.

6. A semiconductor integrated circuit comprising:
   a first abnormality detector configured to detect a first abnormality in the semiconductor integrated circuit, and output a first detection signal;
   a second abnormality detector configured to detect a second abnormality in the semiconductor integrated circuit, and output a second detection signal;
   a first switch electrically connected between a power supply terminal and a ground terminal, the first switch having a gate which is electrically connected to an output of the first abnormality detector;
   a second switch electrically connected in parallel with the first switch between the power supply terminal and the ground terminal, the second switch having a gate which is electrically connected to an output of the second abnormality detector;
   a first transistor electrically connected to a first end of the first switch in series with the first switch between the power supply terminal and the ground terminal and through which a first source-drain current flows when the first switch is turned on;
   a second transistor electrically connected a first end of the second switch in series with the second switch between the power supply terminal and the ground terminal and through which a second source-drain current, different from the first source-drain current, flows when the second switch is turned on, the second transistor having a gate that is electrically connected to a gate of the first transistor; and
   an output terminal electrically connected to a node electrically connected to second ends of the first and second switches, and through which a current is output as an error signal.

7. The semiconductor integrated circuit according to claim 6, wherein the node is between the power supply terminal and the second ends of the first and second switches.

8. The semiconductor integrated circuit according to claim 7, further comprising:
   a NOR circuit to which the first and second detection signals are supplied as inputs to the NOR circuit; and
   a third switch electrically connected between the power supply terminal and the node and having a gate electrically connected to an output of the NOR circuit.

9. The semiconductor integrated circuit according to claim 6, wherein the node is between the ground terminal and the second ends of the first and second switches.

10. The semiconductor integrated circuit according to claim 9, further comprising:
    a NOR circuit to which the first and second detection signals are supplied as inputs to the NOR circuit; and
    a third switch electrically connected between the ground terminal and the node and having a gate electrically connected to an output of the NOR circuit.

11. A semiconductor integrated circuit comprising:
    a first abnormality detector configured to detect a first abnormality in the semiconductor integrated circuit, and output a first detection signal;
    a second abnormality detector configured to detect a second abnormality in the semiconductor integrated circuit, and output a second detection signal;
    an oscillation circuit electrically connected to outputs of the first abnormality detector and the second abnormality detector, and configured to change a characteristic of an alternating current signal generated thereby, depending on the first detection signal and the second detection signal; and an output terminal electrically connected to an output of the oscillation circuit, and through which the alternating current signal is output as an error signal.

12. The semiconductor integrated circuit according to claim 11, wherein a frequency of the alternating current signal is the characteristic of the alternating current signal that is changed.

13. The semiconductor integrated circuit according to claim 12, wherein
the oscillation circuit is a ring oscillator in which a plurality of inverters is connected in series, and
at least one power supply potential of one of the inverters is controlled in accordance with the detection signals.

14. The semiconductor integrated circuit according to claim 11, wherein a duty cycle of the alternating current signal is the characteristic of the alternating current signal that is changed.

15. The semiconductor integrated circuit according to claim 14, wherein
the oscillation circuit includes a ring oscillator connected in parallel with a variable resistor that is controlled in accordance with the detection signals.

* * * * *